(12) United States Patent
Sundararaman et al.

(10) Patent No.: US 6,175,261 B1
(45) Date of Patent: Jan. 16, 2001

(54) FUSE CELL FOR ON-CHIP TRIMMING

(75) Inventors: Rajagopal Sundararaman, Fullerton; Geert Deveirman, Irvine; Jay Standiford, San Juan Capistrano; Simon Willard, Irvine; Michael McNutt, Lake Forest, all of CA (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/226,465

(22) Filed: Jan. 7, 1999

(51) Int. Cl.[7] ........................... H01H 37/76; H01H 85/00
(52) U.S. Cl. .............................................. 327/525
(58) Field of Search ................................ 327/525, 545; 365/96, 225.7

(56) References Cited

U.S. PATENT DOCUMENTS

| | | | |
|---|---|---|---|
| 5,404,049 | * 4/1995 | Canada et al. | 327/525 |
| 5,514,980 | * 5/1996 | Pilling et al. | 327/525 |
| 5,767,732 | * 6/1998 | Lee et al. | 327/525 |
| 5,838,076 | * 11/1998 | Zarrabian et al. | 327/525 |
| 6,014,052 | * 1/2000 | Coupe, II | 327/525 |
| 6,060,899 | * 5/2000 | Hamada | 324/765 |

* cited by examiner

Primary Examiner—My-Trang Nu Ton

(74) Attorney, Agent, or Firm—J. Dennis Moore; Wade James Brady, III; Frederick J. Telecky, Jr.

(57) ABSTRACT

An on-chip fuse circuit. The circuit includes a fuse capable of being blown during a programming operation, as well as output logic for determining whether the fuse is blown. A protection circuit is provided for protecting the output logic during programming. An evaluation circuit is provided, for evaluating whether the fuse is blown. The evaluation circuit includes a first current source coupled to the fuse, providing a first predetermined current so as to activate the output logic to read out the condition of the fuse during normal operation, as well as a second current source coupled to the fuse, providing a second predetermined current, substantially less than the first predetermined current, so as to activate the output logic to read out the condition of the fuse during an evaluation mode such that a blown condition is indicated by the output logic only if the resistance of the fuse is substantially greater than that required for the output logic to indicate a blown condition during normal operation. According to another aspect of the invention there is provided an on-chip fuse circuit including a first fuse and a second fuse, both being capable of being blown during a programming operation. Output logic is provided for determining whether the fuse is blown, the output logic including first indication logic for indicating whether both of the fuses are blown, during an evaluation mode, and second indication logic for indicating a blown state of the fuse circuit if either of the fuses is blown. A protection circuit is provided for protecting the output logic during programming. An evaluation circuit is provided for evaluating whether the fuse is blown.

15 Claims, 4 Drawing Sheets

FUSE CELL FOR ON-CHIP TRIMMING

TECHNICAL FIELD OF THE INVENTION

The present invention relates to integrated circuit adjustment structures and methods, and more particularly relates to fuse circuits for making on-chip adjustments.

BACKGROUND OF THE INVENTION

In integrated circuit design the provision of adjustment capability, or trimming, is often desirable or even needed. For example, in a computer hard drive ("HDD") read channel integrated circuit, the cutoff frequency of the continuous time low pass filter, the free running center frequency of the time recovery voltage controlled oscillators, and various DC offsets may be advantageously centered by blowing fuses.

Fuses may be used to switch in additional unit capacitances in a capacitor bank as needed based on the particular process run and as determined by functional measurement at wafer probe or during final test. Alternatively, the value of a transconductance can be trimmed to account for the process variation in capacitors. For example, the reference current used in the transconductance control loop can be scaled up or down by means of a fusible digital to analog converter ("DAC") to provide the proper compensation for the deviation in capacitors.

Another application for fuses is in the correction of unavoidable DC offsets, which if allowed to build up can severely degrade the performance of analog cells. In some cases, offset-correction loops or auto-zero techniques are not desirable/possible and a one time offset-correction trim is done instead at wafer probe or final test. Fuses, which control currents in a DAC, can be blown and these currents can be injected into certain nodes of the analog circuit in such a way that they counteract the offset.

The foregoing is a description of exemplary uses for fuses. Those skilled in the art understand that fuses are used for many other purposes beyond those described herein.

The various prior art fuse schemes have limitations and problems that it would be desirable to overcome. For example, as alluded to above, in prior art schemes fuses are typically blown as determined by functional measurement at wafer probe. Subsequent packaging, however, may stress the chip such that optimal fuse compensation may change.

In addition, the supply voltage must be raised to blow fuses, typically, and this puts other low voltage process circuitry at risk of damage. Further, the resistance remaining in a path after a fuse is blown may be lower than desired. After a fuse is blown, a DC current is typically forced through the fuse. With a lower than desired resistance in the fuse power consumption may be unacceptably large during evaluation. To overcome this the resistance requirement placed on a blown fuse may be made quite large, resulting in a high number of rejected parts after attempted fuse blowing.

In addition, the continuous current flow through the fuse may result in regrowth of the fuse, causing the resistance of the fuse to lower still further. This may bring the fuse to the point where the voltage drop across it during operation is at or close to the transition voltage between a blown and un-blown indication. The read state of the fuse may thus fluctuate between blown and un-blown, rendering it unstable in use. In some applications this could be highly objectionable. For example, for fuses used to trim parameters in an HDD read channel a stable, but incorrect fuse reading might be more tolerable than a fuse reading varying between blown and un-blown, since the channel may adapt other parameters during operation to partially compensate for an incorrect fuse state and provide acceptable performance. However, an unstable fuse, changing its read state between blown and un-blown may cause the read channel to continually adapt and re-adapt to the changing channel configuration created by the unstable fuse.

Therefore, it would be desirable to have a fuse circuit that permits the blowing of the fuse on-chip, i.e., after packaging. It would be desirable to have a fuse circuit suitable for low voltage processes. It would be desirable to have a fuse circuit that provides protection for other circuitry when the supply voltage is raised to blow the fuses. It would be desirable to have a fuse circuit providing more certainty regarding the remaining resistance after blowing of the fuse. It would be desirable to have a fuse circuit requiring lower power consumption and preventing regrowth of a blown fuse.

The present invention overcomes the foregoing limitations and problems.

SUMMARY OF THE INVENTION

The present invention provides, according to one aspect, an on-chip fuse circuit. The circuit includes a fuse capable of being blown during a programming operation, as well as output logic for determining whether the fuse is blown. A protection circuit is provided for protecting the output logic during programming. An evaluation circuit is provided, for evaluating whether the fuse is blown. The evaluation circuit includes a first current source coupled to the fuse, providing a first predetermined current so as to activate the output logic to read out the condition of the fuse during normal operation. It also includes a second current source coupled to the fuse, providing a second predetermined current, substantially less than the first predetermined current. The second predetermined current activates the output logic to read out the condition of the fuse during an evaluation mode such that a blown condition is indicated by the output logic only if the resistance of the fuse is substantially greater than that required for the output logic to indicate a blown condition during normal operation.

According to another aspect of the invention there is provided an on-chip fuse circuit including a first fuse and a second fuse, both being capable of being blown during a programming operation. Output logic is provided for determining whether the fuse is blown, the output logic including first indication logic for indicating whether both of the fuses are blown, during an evaluation mode, and second indication logic for indicating a blown state of the fuse circuit if either of the fuses is blown. A protection circuit is provided for protecting the output logic during programming. Finally, an evaluation circuit is provided for evaluating whether the fuse is blown.

These and other aspects and features of the invention will be apparent to those skilled in the art from the following detailed description of the invention, taken together with the accompanying drawings.

DESCRIPTION OF PREFERRED EMBODIMENTS OF THE PRESENT INVENTION

Figure 1:
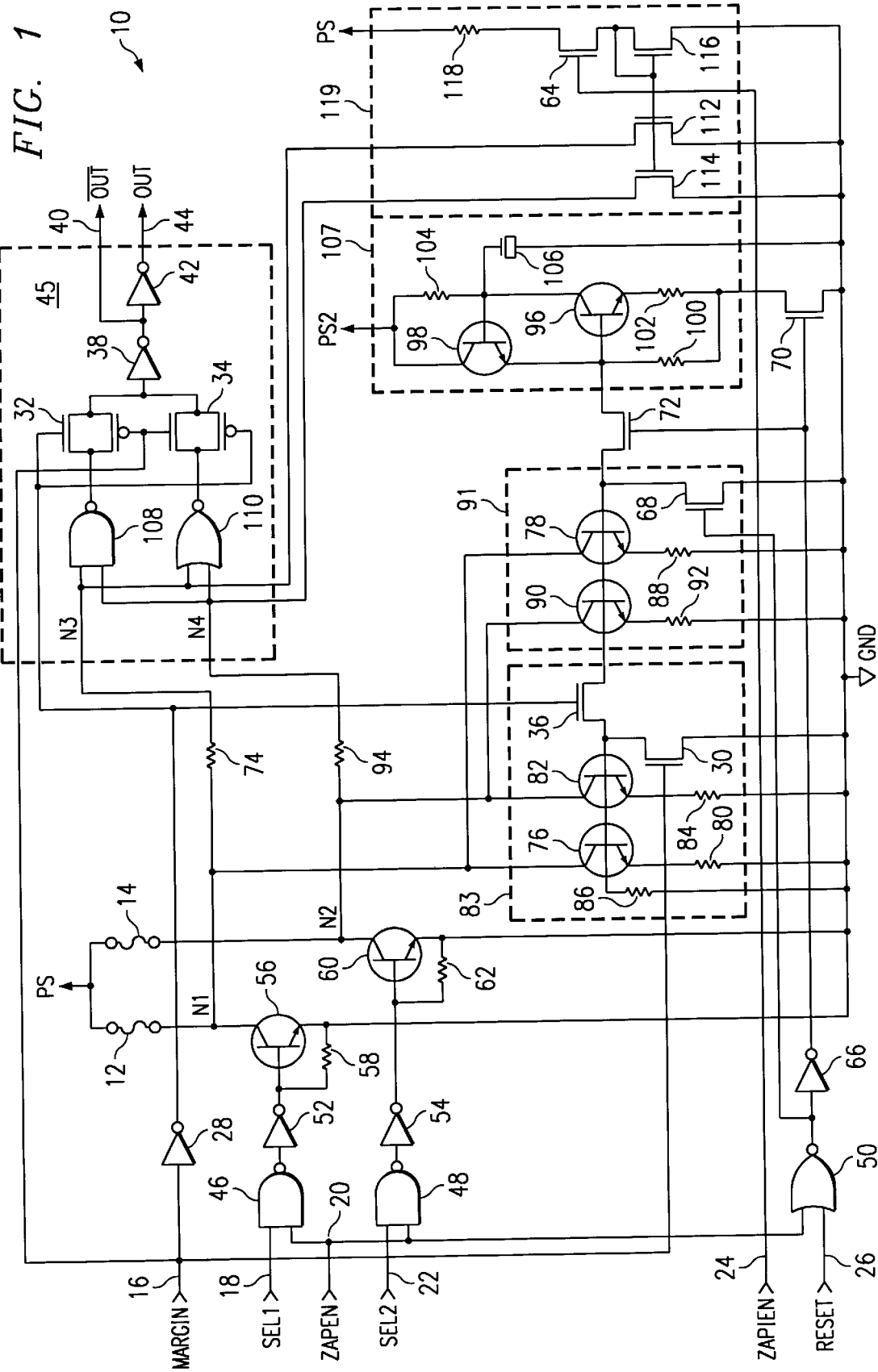
FIG. 1 is a schematic diagram of a preferred embodiment of the present invention, illustrating an on-chip fuse cell.

FIG. 1 shows an on-chip fuse cell circuit 10 that can be used for fine trimming any circuit capable of fuse-type trimming. For example, it might be used on any of the different adjustable circuits inside of a read channel chip. However, it is in no way limited to such an application. The circuit 10 can be programmed for blowing the fuse by writing to a control register through a serial port. The blown fuse value can also be stored in a trim register through the serial port. The fuse cell circuit 10 has several new features that make it a comprehensive on-chip trimming option.

The fuse cell circuit 10 actually includes two fuses, a first fuse 12 and a second fuse 14. The circuit is connected between a power supply PS and ground GND. PS is provided at a nominal voltage for normal operation of the circuitry. However, PS also has the capability of being raised to a level sufficient to blow the fuses during a programming operation. The selection of these voltage levels for a given design will depend on many factors, such as the particular process technology and performance objectives, and is well within the scope of competency of the routineer in this art. Important to the application of the principles of the present invention, however, is that the high voltage be sufficient to blow a fuse, and that adequate protection to the low-voltage circuitry be provided during fuse blowing. An exemplary low/high voltage level might be 3.3 volts, with the capability of ramping up to 8.5 volts during programming, i.e., fuse blowing. However, in other designs employing the principles of the present invention these levels may vary considerably from the specific exemplary levels mentioned here.

Six control signals control the operation of the fuse cell circuit 10. The control signals are MARGIN, SEL1, ZAPEN, SEL2, ZAPIEN and RESET. The signal MARGIN is applied on input line 16, signal SEL1 is provided on input line 18, the signal ZAPEN is applied to input line 20, signal SEL2 is applied to input line 22, signal ZAPIEN is applied to input line 24, and input signal RESET is applied to input line 26. The input line 16 is applied to the input of an inverter 28, to the gate of a field effect transistor ("FET") 30, to the gate of a p-channel field effect transistor ("PFET") 32B which, with an n-channel field effect transistor ("NFET") 32A connected in parallel with PFET 32B, make up a first passgate 32, and to an NFET 34A which, with a PFET 34B connected in parallel with NFET 34A, make up a second passgate 34. The output of inverter 28 is applied to the gate of a FET 36, to PFET 34B and to NFET 32A. The outputs of passgate 32 and passgate 34 are both applied to the input of an inverter 38. The output of inverter 38 is line 40, on which the inverted output signal $\overline{OUT}$ is provided. Line 40 is also applied to the input of another inverter 42, the output of which is applied to line 44 on which the output signal OUT is provided. Together, elements 32, 34, 38, 42, 108 and 110 form an output logic block 45.

Input line 18 is provided to one input of a NAND gate 46. Input line 20 is provided to the other input of NAND gate 46 and to an input of a further NAND gate 48. Input line 20 is also provided to an input of a NOR gate 50. Input line 22 is provided to the other input of NAND gate 48.

The output of NAND gate 46 is provided to the input of an inverter 52. The output of NAND gate 48 is provided to the input of an inverter 54. The output of inverter 52 is provided to the base of a large NPN bipolar transistor 56. A resistor 58 is connected between the base and emitter of transistor 56. The emitter of transistor 56 is connected also to ground. The collector of transistor 56 is connected to one end of the first fuse 12, the other end of which is connected to the power supply PS. The output of inverter 54 is provided to the base of a second large NPN bipolar transistor 60. A resistor 62 is connected between the base and emitter of transistor 60. The emitter of transistor 60 is also connected to GND, while the collector of transistor 60 is connected to one end of the second fuse 14, the other end of which is connected to the power supply PS.

Input line 24 is connected to the gate of FET 64. Input line 26 is connected to the other input of NOR gate 50. The output of NOR gate 50 is provided to the input of inverter 66 and to the gate of FET 68. The output of inverter 66 is provided to the gate of FET 70 and to the gate of FET 72.

The common connection point for the collector of transistor 56 and the first fuse 12 is connected to resistor 74 to the collector of an NPN transistor 76 and to the collector of a further NPN transistor 78. The emitter of transistor 76 is connected to one end of resistor 80 the other end of which is connected to GND. The base of transistor 76 is connected to the base of a further NPN transistor 82. The emitter of transistor 82 is connected to one end of a resistor 84, the other end of which is connected to GND. The bases of transistors 76 and 82 are also connected to one end of a resistor 86 the other end of which is connected to GND, and are connected to the drain of FET 30, the source of which is connected to GND, and to the source of FET 36. The emitter of transistor 78 is connected to one end of resistor 88, the other end of which is connected to GND. The base of transistor 78 is connected to the base of further NPN transistor 90 and to the drain of FET 36. The base of transistor 78 is connected to the drain of FET 72 and to the drain of FET 68. The source of FET 68 is connected to ground. The emitter of transistor 90 is connected to one end of resistor 92, the other end of which is connected to GND.

The common connection point for the second fuse 14 and transistor 60 is connected to resistor 94, to the collector of transistor 82 and to the collector of transistor 90.

The source of transistor 72 is connected to the base of a further NPN transistor 96, to the emitter of a further NPN transistor 98, and to one end of resistor 100. The emitter of transistor 96 is connected to one end of resistor 102. The other ends of resistors 100 and 102 are connected together and to the drain of FET 70. The collector of transistor 96 is connected to the base of transistor 98 and to one end of resistor 104. The other end of resistor 104 is connected to a second power supply PS2, as is the collector of transistor 98. The base of transistor 98 is connected also to one side of capacitor 106, the other side of which is connected to GND.

The other side of resistor 74 is connected to one input of NAND gate 108 to one input of NOR gate 110, and to the drain of FET 112. The other side of resistor 94 is connected to the other input of NAND gate 108, the other input of NOR gate 110 and to the drain of FET 114. The sources of both FET 112 and FET 114 are connected to GND. The gates of FETs 112 and 114 are connected together and to the gate of FET 116. The gate of FET 116 is also connected to the drain of FET 116, the source of FET 116 being connected to GND. The drain of FET 116 is connected to the source of FET 64. The drain of FET 64 is connected to one end of a resistor 118, the other end of which is connected to the power supply PS. Together, elements 64, 112, 114, 116 and 118 form a protection circuit 119 that generates during a fuse blowing operation a current that operates, with resistors 74 and 94, to protect gates 108 and 110.

Before discussing the operation of the fuse cell circuit 10 of FIG. 1, it should be noted that circuit 10 includes two fuses, a first fuse 12 and a second fuse 14, as mentioned above. The IR (current times resistance) voltage drop across the fuse is checked to determine whether it is blown or not. In the unblown state the IR drop is low. To indicate a blown state, which is signaled by a logic high OUT signal, the IR drop across the fuse must exceed the threshold voltage of the evaluation circuit, i.e., the output logic block 45.

The circuit 10 is designed such that the blown resistances of these two fuses during normal operation may have degraded to the point of being considerably lower than that required to pass margin test and still provide the correct indication. This is because of two advantageous features. First, there is fuse redundancy—two fuses are provided, only one of which need be operational for a proper indication of the fuse blown state during normal operation. Thus, if the resistance of one of the fuses decreases over time, for example by re-growth, the fuse circuit remains operational, provided the other fuse still maintains sufficiently high resistance.

In addition, the parameters of the circuit 10 are selected, as described in detail below, such that a lower resistance during normal operation than that required to pass the margin test still causes the blown state to be indicated. No excessive power dissipation is required for this capability, however, since the state of the fuse is evaluated only at circuit start-up, when RESET is applied. The state of the fuse is stored in a register for use during normal operation of the circuit. Then, the voltage is removed from the fuses.

In the particular embodiment shown in FIG. 1, the lower limit of blown fuse resistance that is permitted is approximately 10 KΩ for proper logic operation. However, that value was merely a design choice, other resistances being subject to the particular choices of the circuit designer.

As mentioned above, one end of each fuse 12, 14, is connected to the supply pads, being provided with power supply PS voltage that is ramped up from nominal voltage to programming voltage during programming, while the other ends of fuses 12, 14, are connected to the collectors of large NPN transistors 56 and 60. These transistors 56, 60, provide the large current necessary to blow fuses 12, 14, during programming. Note that, as a safety feature, transistors 56, 60, are provided with resistors 58 and 62, respectively, that act as pull-downs to enable transistors 56, 60 to withstand up to 10 volts during an electrostatic discharge ("ESD") pulse.

Transistors 56, 60, should be constructed of a size sufficient to enable them to handle the high currents that are generated during the fuse blowing operation. Typically, only one fuse should be blown at a time, so as not to create excessive power supply demands, and there should be sufficient delay between current pulses so as to allow recovery of the current supply. Also, IR voltage drops on-chip take away from the supply voltage available for the fuse. However, in some embodiments it may be desired to have more than one fuse blown at a time, justifying a more robust power supply. All such variations are within the scope of this aspect of the present invention.

Before either fuse is blown the low-voltage circuitry is protected from the high voltage applied during fuse blowing, by having ZAPIEN driven to a high logic level, which is maintained during the fuse blowing operation. Activation of ZAPIEN turns FET 64 on, which allows current to flow through FET 116. The current in FET 116 is mirrored in FET 112 and FET 114, resulting in an IR voltage drop across resistors 74 and 94, respectively, when the high fuse blowing voltage is applied to the power supply pad PS. It is important to note here that the current in FET 116 and mirrored in FET 112 and FET 114 tracks the ramping up of PS resulting in adequate IR drop across resistors 74 and 94, thus preventing the voltage at nodes N3 and N4 from rising above a level that is destructive to NAND gate 108 and NOR gate 110.

The fuse to be blown is chosen by activating the appropriate SEL line, SEL1 or SEL2, in order to enable the first fuse 12 or the second fuse 14, respectively. To actually blow the fuse, the appropriate SEL line is selected, and the power supply PS is raised to programming voltage. Then the ZAPEN line is activated. As can be seen, this results in the output of either NAND gate 46 or NAND gate 48 to be driven low, thus causing the output of inverter 52 or inverter 54, respectively, to be driven high. This, in turn, turns on transistor 56 or transistor 60, respectively. Inverters 52 and 54 should be constructed of devices large enough to provide the necessary current to the base of transistors 56 and 60, respectively, to provide a rapid pulse of programming voltage to the fuses, to ensure that they are blown.

After the fuses are blown they are evaluated by the application of a margin test evaluation current. The resulting IR drop across both fuses is sensed (by NOR gate 110) to determine whether the remaining resistance of both fuses is sufficiently high to pass the evaluation, i.e., that they are sufficiently blown. This margin test evaluation current is developed by a current mirror 91, and is smaller than the evaluation current developed by a second current mirror 83 that is applied in conjunction with the current developed by current mirror 91 during normal operation to sense the state of the fuse. The smaller margin test evaluation current thus requires a higher blown resistance in both fuses than is necessary for a correct indication of fuse state during normal operation, so as to provide the above-mentioned margin against fuse degradation over time. Note also in this connection that while both fuses must demonstrate the higher resistance to pass the margin test as just described, nonetheless during normal operation only one fuse need demonstrate the lower operational resistance for the correct fuse state to be indicated. This will now be explained in detail.

Transistors 96 and 98, resistors 100, 102, 104, and capacitor 106 form a current source 107. Capacitor 106 provides stability against oscillation. The current flowing in this current source 107 is mirrored in transistors 78, 90, 82 and 76. Transistors 78 and 90 form a first dual current mirror circuit 91 for fuse evaluation during margin test and during normal operation. These transistors are constructed, and their respective emitter resistances 88, 92, are selected in this particular embodiment to be the appropriate size, such that each transistor 78, 90, provides one-third the current flowing through transistor 96. Transistors 76 and 82 form a second dual current mirror circuit 83 for fuse evaluation during normal operation only, i.e., not during margin test. These transistors are constructed of a size, and their respective emitter resistances 80, 84, are selected in this particular embodiment to have the appropriate size such that each transistor 76 and 82 provides three times the current flowing through transistor 96.

As mentioned above, the smaller current, provided by current mirror 91 alone, is used during margin test to test the blown state of the fuses 12, 14, while the currents of both current mirrors 83 and 91 are used during normal operation for the test. This particular ratio of currents provides a ten to one ratio of current between normal operation and margin test, to provide a ten to one margin between the blown resistance required to pass the margin test and the blown resistance required to indicate proper fuse state in normal operation. This ratio provides a considerable cushion against such phenomena as fuse re-growth over time, proving a given part with the potential for a considerably longer useful lifetime.

However, it will be appreciated that these particular ratios of current are a matter of design choice, and may vary widely depending on the requirements and objectives of the circuit designer. In addition, the selected ratio may be set up with different configurations.

For example, current ratios of 1:1 and 9:1 may be used, rather than 1/3:1 and 3:1. All such variations are within the scope of this aspect of the present invention. The important consideration is to provide a blown fuse resistance margin to extend the useful life of the part.

Activation of the ZAPEN 20 also causes the output of NOR gate 50 to be driven low. This, in tun, causes the output of inverter 66 to be driven high. Together, the output of NOR gate 50 and the output of inverter 66 turn on FET 70 and FET 72, while turning off FET 68. The overall effect of this is to turn on the current source 107 and current mirror 91.

When the MARGIN signal on input line 16 is activated, FET 30 is turned on, which turns off current mirror circuit 83, i.e., transistors 76 and 82. The application of the MARGIN signal thus reduces the total evaluation current by the selected amount, in this embodiment by a factor of ten, which ensures that the blown fuse resistance is as great as the target magnitude, in this embodiment at least 100 KΩ, to pass this part of the evaluation, as will now be described.

After both fuses 12, 14, are blown, the MARGIN signal on input line 16 and the RESET signal on input line 26 are both activated. When line 16 is driven high, the output of inverter 28 is driven low. Together, the high level on line 16 and the low level at the output of inverter 28 activate passgate 34, allowing the production of an evaluation signal, which is provided through inverters 38 and 42 as the output signal OUT.

The output signal OUT is developed as follows. The activation of the RESET signal on input line 26 drives the output of NOR gate 50 low, and the output of inverter 66 high, thus turning transistors 70 and 72 on. This turns on current source 107 and makes the voltage at the base of transistor 96 available for current mirrors 91 and 83, but only when the MARGIN is low—note that current mirror circuit 83 is off when MARGIN is high. Thus, as mentioned above, with the MARGIN signal on, input line 16 being high, only the low level evaluation current, here one-third of the current flowing through transistor 96, is sunk against the first fuse 12 by transistor 78 and against the second fuse 14 by transistor 90, respectively. This provides the above-described margin during evaluation to confirm complete blowing of the fuse.

Looking at the first fuse 12 by way of example, if the first fuse 12 has a sufficiently high resistance after being blown, the collector of transistor 78 will be low. This low state is communicated through resistor 74 to one input of NAND gate 108 and one input of NOR gate 110. If the blown resistance of the second fuse 14 is also sufficiently high, similarly, a low value will be passed through resistor 94 to the other input of NAND gate 108 and of NOR gate 110.

Now, when the MARGIN signal is active, it turns pass gate 34 on, while turning pass gate 32 off. Conversely, when the MARGIN signal is inactive, it turns pass gate 34 off, while turning pass gate 32 on. In this case, when MARGIN is active both fuses 12, 14, must be blown to the aforementioned desired high margin test resistance value in order to obtain a high OUT signal. (Recall that when MARGIN is active current mirror 83 is turned off.)

On the other hand, when MARGIN is not active, which is the case during normal operation, current mirror 83 is on, pass gate 32 is on, while pass gate 34 is off. In this case, if either fuse 12, 14, has the lower operational resistance such that the output of NAND gate 108 is driven high, the proper high OUT signal is thereby provided. Thus, the aforementioned resistance margin and redundancy are both provided.

In normal operation, the RESET signal is driven high after a brief delay following the fuse blowing operation, to evaluate the condition of the fuses, using the MARGIN signal as described above.

Once all fuses are blown to their desired state for a given integrated circuit part, in normal operation the MARGIN signal will not be activated, and the OUT signal may simply be provided to a volatile memory, such as a register that stores all such trim values, where the value thus loaded provides the desired trimming function. The RESET signal may be used as a LOAD enable signal in such configurations.

Figure 2:
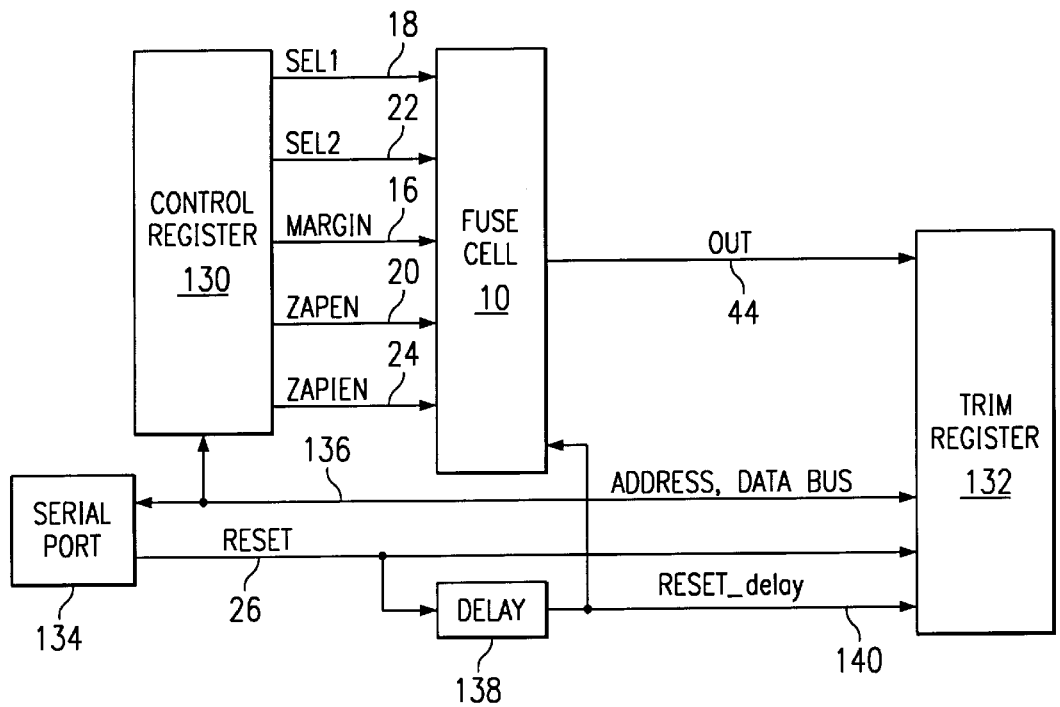
FIG. 2 is a block diagram illustrating an application of the fuse cell of FIG. 1 in a serial port-register configuration.

In some embodiments it may be desirable to delay the storing of the OUT signal in such a trim register, by delaying the provision of the RESET signal to the trim register, such as is shown in FIG. 2. Thus, where a fuse circuit according to the present invention is provided as a retro-fit to an existing circuit in which the trim register is pre-loaded during power-on-reset with default values, the delayed RESET signal, RESET_delay, to the trim register allows the programmed values to be subsequently loaded, i.e., after the loading of the default values. This prevents the circuit attempting to load possibly two different values to the same location in the trim register at the same time. This requires the delayed signal RESET_delay to be provided to the fuse cell 10 in the place of the RESET signal (i.e., line 26 in FIG. 1 would be replaced with line 140, as shown in FIG. 2) for proper coordination of timing.

The serial port allows loading of test values in the trim register prior to the programming of the cell, to determine the optimum programming state. The cell is then programmed with the desired state, which is thereafter loaded into the trim register as described above.

As shown in FIG. 2, a control register 130 provides the signals SEL1, SEL2, MARGIN, ZAPEN and ZAPIEN on lines 18, 22, 16, 29, 24, respectively, to a fuse cell 10. The OUT signal is provided on line 44 to a trim register 132. A serial port 134 is connected to address and data busses 136 to send and receive control signals and data to/from the control register 130 and the trim register 132. The RESET signal is provided on line 26 from the serial port 134 to the trim register 132 for loading the default value, and to a delay 138, which may be a conventional one-shot. The output of the delay 138, the RESET_delay signal, is provided on line 140 to the fuse cell 10, and to the trim register 132 to load the OUT value, as described above. While only the OUT signal is provided to the trim register 132 in this configuration, the $\overline{\text{OUT}}$ signal is also available, and in some designs it may be desirable to save this value in the trim register 132, as well.

A procedure that may be used in connection with the circuit 10 of FIG. 1 is as follows.

1. Drive ZAPIEN high (active).
2. Select a fuse, e.g. fuse 14, by driving its associated select line high, e.g., SEL2 on line 22 for fuse 14.
3. Ramp up the power supply voltage PS from nominal voltage to programming voltage. The output signal OUT is low at this time.
4. Drive ZAPEN high. This turns on transistors 60, 96, 98, 78, 90, 82 and 76. Fuse 14 blows. The current flowing through transistors 116, 112 and 114 and resistors 74 and 94 restricts the voltage at the inputs of gates 108 and 110 from going too high.
5. Turn ZAPEN off. Lower PS to nominal voltage.
6. Select the next fuse and repeat steps 3 through 5 for that fuse. (Note that, preferably, both fuses should be required to be blown in each cell to ensure that final test under MARGIN conditions will pass.)
7. After all fuses are blown, turn ZAPIEN off.
8. Apply the MARGIN signal and the RESET signal (the RESET_delay signal, if using a configuration like that shown in FIG. 2). This rigorously evaluates the blown condition of the cell by causing OUT to go high only if both fuses in the cell are blown. If OUT is low, then the part has failed the test, and should be discarded.
9. The RESET (alternatively, the RESET_delay) signal also enables the OUT value from the cell to be written to a trim register, as described above.
10. After all the fuses are blown repeat steps 1 through 7 to blow a "Part Programmed" fuse in a cell that may be identical to cell 10 of FIG. 1, to indicate that the part has been successfully programmed. The latched value from this Part Programmed fuse may be connected to disable ZAPEN and MARGIN, and to prevent any further accidental overwriting to the trim registers, as described further below. Note that the Part Programmed fuse should only be blown after the margin test is applied. The serial port interface is then disabled.

Figure 3:
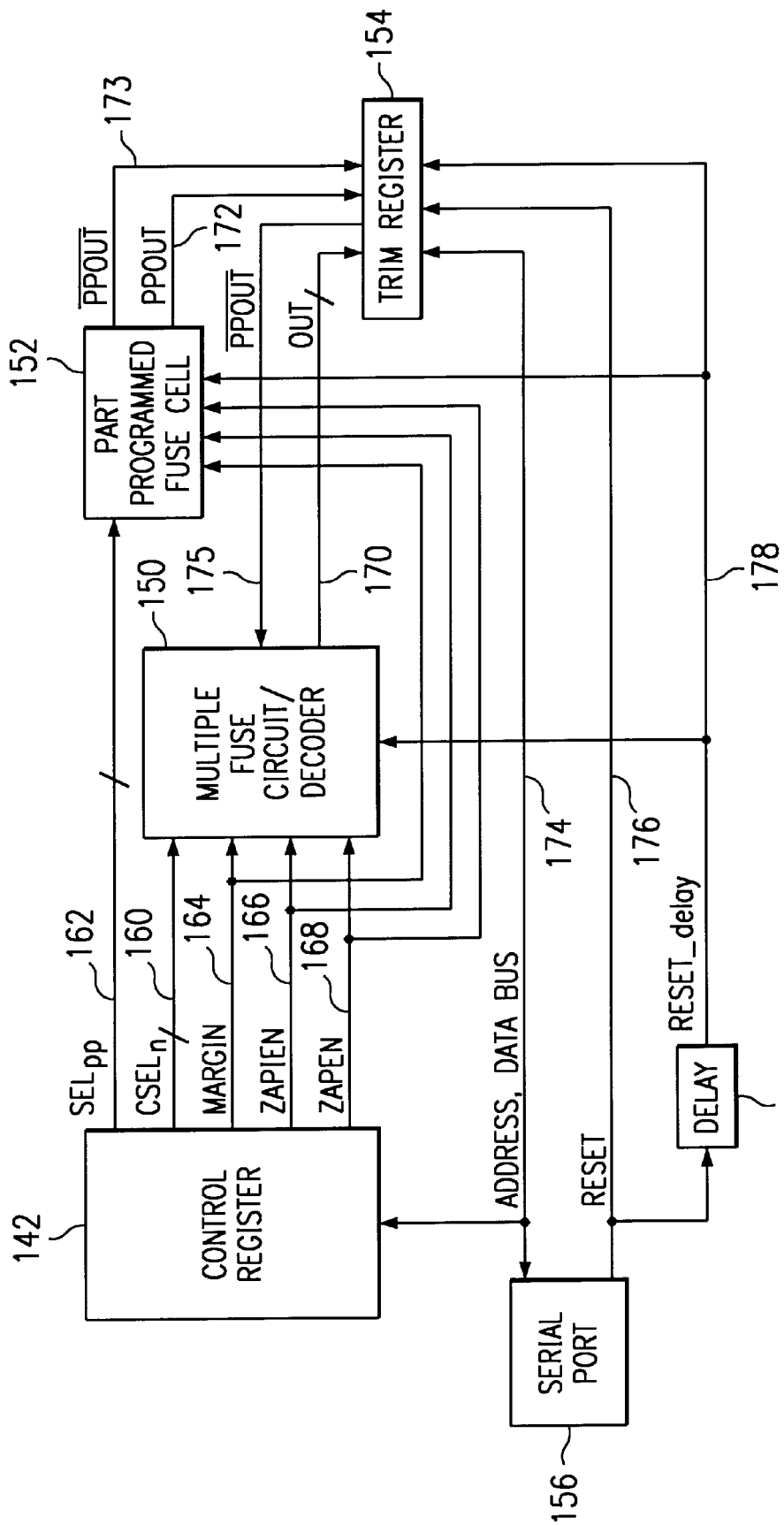
FIG. 3 is a block diagram illustrating an application of the fuse cell of FIG. 1 in a multiple fuse block and serial port-register configuration.

Several fuse cells may be grouped in a fuse block for a particular circuit, or even a particular IC chip. FIG. 3 shows an example of such a block 150 in an arrangement similar to that of FIG. 2, that is, in a configuration including a trim register 154 and a serial port 156. In FIG. 3, however, a multiple fuse circuit/decoder 150 is provided instead of the single fuse cell 10 of FIG. 2. Instead of two select lines, SEL1 18 and SEL2 22, as in FIG. 2, in FIG. 3 a coded select bus CSELn 160 is provided to the multiple fuse circuit/decoder 150. Coded signals are provided on bus CSELn 160, which are decoded in the multiple fuse circuit/decoder 150 to activate select lines for selected fuses to be blown in the multiple fuse circuit/decoder 150. Using coded signals reduces the number of bits required to be transferred through serial port 156 and stored in control register 142 to indicate the current selected fuse.

Each fuse has its own OUT signal, provided on an OUT bus 170 to trim register 154, wherein each fuse has a dedicated line in bus 170. Other arrangements are possible for outputting the OUT signals for storage for subsequent use, and will be readily apparent to those skilled in this art.

In addition, a Part Programmed fuse cell 152 is provided, providing the functions described above. The internal construction of the Part Programmed fuse cell 152 is essentially the same as the construction of fuse cell 10 of FIG. 1. It will be noted that the MARGIN, ZAPEN, ZAPIEN and RESET_delay signals are provided, on lines 164, 168, 166 and 178, respectively, to the Part Programmed fuse cell 152 in addition to being provided to the multiple fuse circuit/decoder 150. A two bit SELpp bus 162 provides the two select lines for selecting the two fuses in the Part Programmed fuse cell 152. Note that both the output signal PPOUT and its inverse, $\overline{\text{PPOUT}}$, are provided to the trim register 154, on lines 172 and 173, respectively. The PPOUT signal is stored in the trim register 154 for reading through the serial port 156, while the signal $\overline{\text{PPOUT}}$ is stored in the trim register 154 for provision, on line 175, to the multiple fuse circuit/decoder 150. The control register 142, serial port 156, delay 158 and trim register 154 are constructed and operate in a similar way to the control register 130, serial port 134, delay 138 and trim register 132 of FIG. 2.

Figure 4:
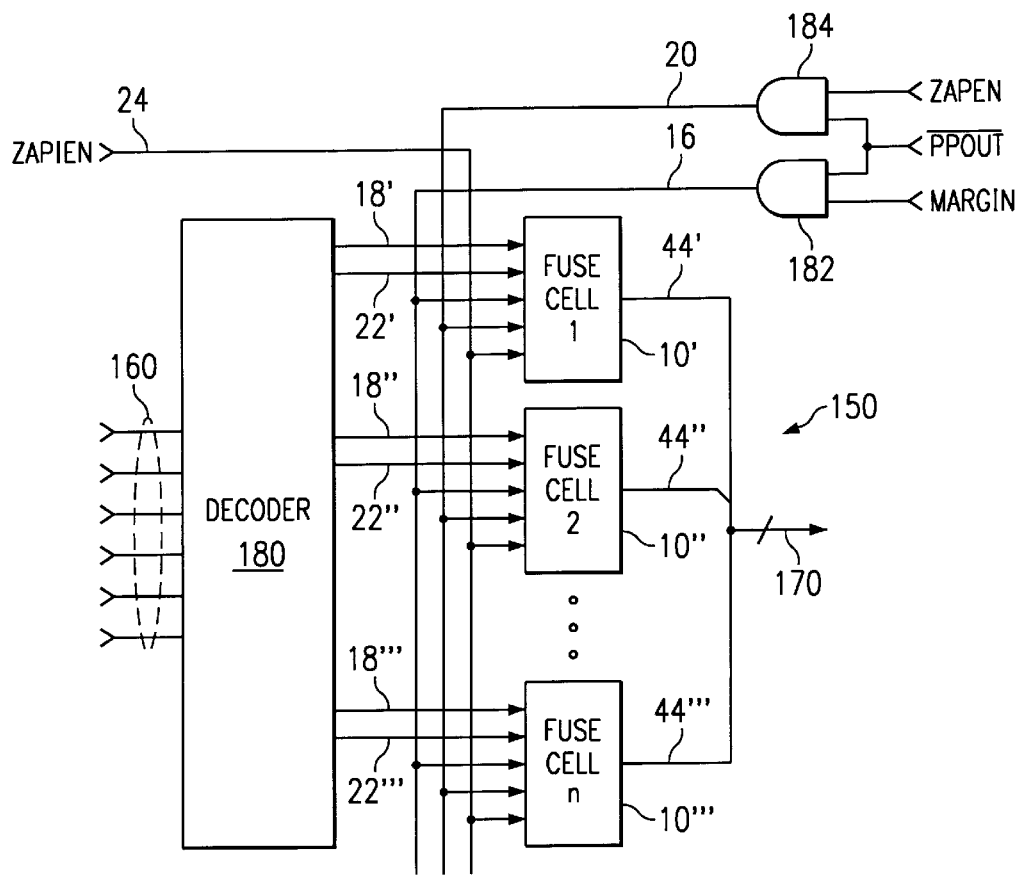
FIG. 4 is a schematic of the multiple fuse block of FIG. 3.

Internal construction of the multiple fuse circuit/decoder 150, including use of the signal $\overline{\text{PPOUT}}$ will now be described in conjunction with FIG. 4. In FIG. 4 there can be seen a decoder 180, which is of conventional construction, receiving the CSELn bus 160. Also provided are n fuse cells, fuse cell 1 10', fuse cell 2 10", ... and fuse cell n 10'''. The decoder 180 provides a SEL1 signal and a SEL2 signal for fuse cell 1 10' on lines 18' and 22', respectively. Likewise, the decoder 180 provides a SEL1 signal and a SEL2 signal for fuse cell 2 10" on lines 18" and 22", respectively, and so on, such that the decoder 180 provides a SEL1 signal and a SEL2 signal for fuse cell n 10''' on lines 18''' and 22''', respectively. Since the decoder 180 activates uniquely only one of these select lines in response to a given code value on input bus 160, this configuration prevents more than one fuse being blown at a time. This is valuable in ensuring that sufficient voltage and current are available to blow a given selected fuse.

The ZAPIEN signal is provided on line 166 directly and in parallel to each of the fuses 10', 10", ... 10'''. The MARGIN and ZAPEN signals, however, are gated by the signal $\overline{\text{PPOUT}}$, provided on line 172, via AND gates 182 and 184, respectively. The gated MARGIN signal is provided in parallel to each of the fuses 10', 10", ... 10''' on line 16', while the gated ZAPEN signal is provided in parallel to each of the fuses 10', 10", ... 10''' on line 20'.

As can be seen in FIG. 4, before the Part Programmed fuse is blown the high level state of $\overline{\text{PPOUT}}$ enables ZAPEN and MARGIN to be provided to fuse cells 10', 10", ... 10'''. After the Part Programmed fuse is blown, however, $\overline{\text{PPOUT}}$ is driven low, blocking ZAPEN and MARGIN from fuse cells 10', 10", ... 10'''. Again, the Part Programmed fuse should only be blown after the margin test is applied. Note that after the Part Programmed fuse is blown the MARGIN signal is still available to be applied to the Part Programmed fuse cell 152 (FIG. 3), should that be desired.

The OUT signals from each of the fuses 10', 10", ... 10''' are provided on lines 44', 44", ... 44''', respectively, to bus 170.

Figure 5:
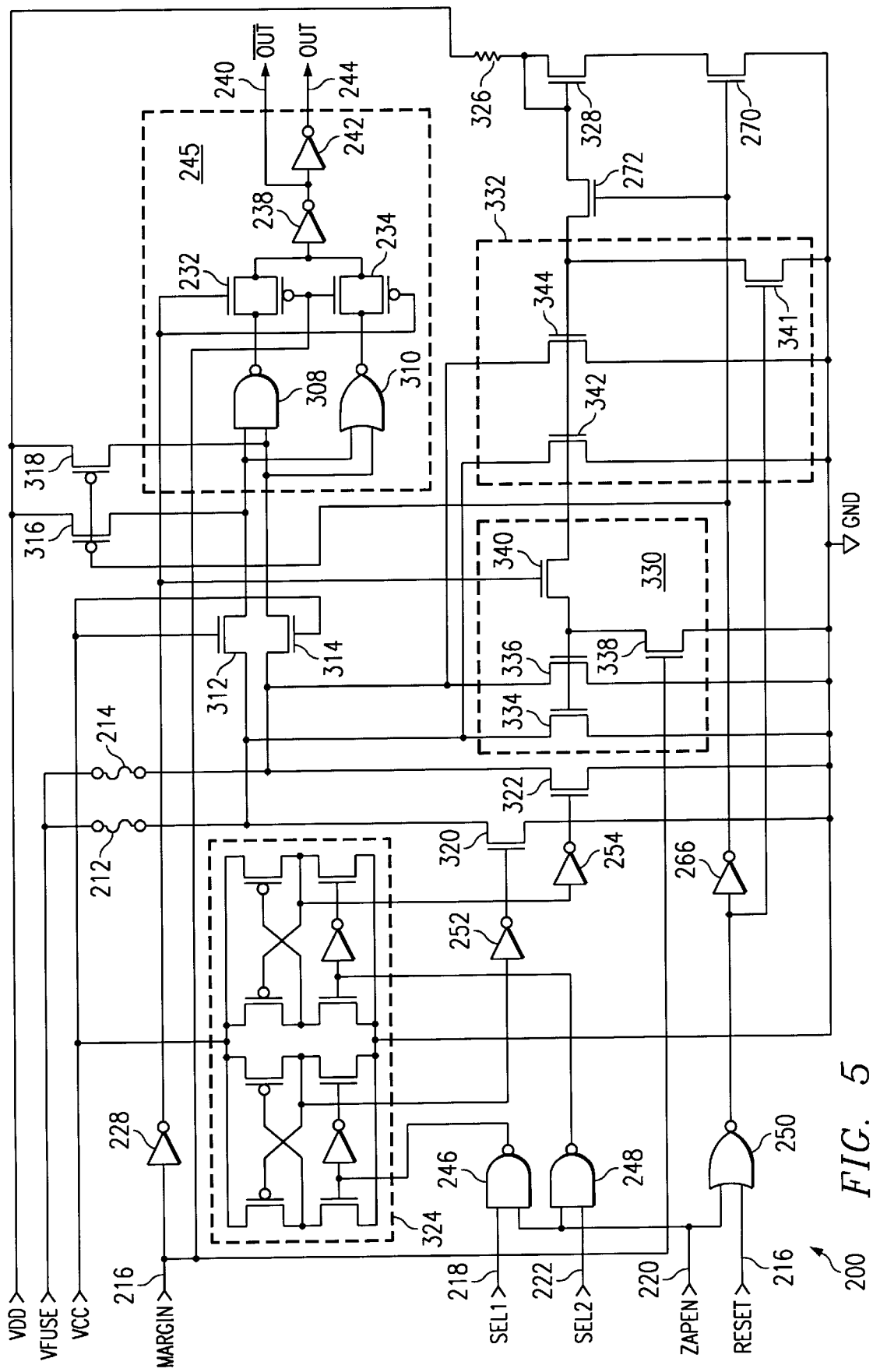
FIG. 5 is an on-chip fuse cell implemented in a CMOS process.

FIG. 5 shows an on-chip fuse cell circuit 200 that functions in a similar way to the fuse cell circuit 10 of FIG. 1. However, fuse cell circuit 200 is an entirely CMOS circuit, while circuit 10 is a BICMOS circuit. As in circuit 10, the signals SEL1, SEL2, ZAPEN, MARGIN and RESET (alternatively, RESET_delay, if using a configuration like that of FIG. 2) are provided as inputs, and the signals OUT and $\overline{\text{OUT}}$ are provided as outputs. Circuit elements in FIG. 5 that have the same function as corresponding circuit elements in FIG. 1 have the same reference numeral as the corresponding elements in FIG. 1, plus 200. Thus, the inverter 228 of FIG. 5, which inverts the MARGIN signal on line 216, performs the same function as the inverter 28 of FIG. 1, which inverts the MARGIN signal on line 16. Note that all of the elements in the output logic block 245 in FIG. 5 perform the same function as the corresponding elements in the output logic block 45 of FIG. 1. The operation of all such elements having the same function as those in FIG. 1 are not re-described herein. Only the differences in circuit 200 of FIG. 5 from the circuit 10 of FIG. 1 are described. Note that the signal ZAPIEN is not included in circuit 200, while it is in circuit 10, since it is not necessary in circuit 200. Protection of the low-voltage circuitry in circuit 200 is provided without the need for an additional signal in a maimer described in detail below.

In circuit 200 a voltage VFUSE is provided separately, being provided to the fuses 212, 214, and providing essentially the same function as PS in FIG. 1. Note that modern CMOS circuits have lower supply voltages, but higher voltage devices are available to be included with them. In applying the principles of the present invention to CMOS it is desirable to take advantage of the higher voltage devices, as needed for protection of the lower voltage devices. The embodiment shown in FIG. 5 illustrates one technique for doing so.

Note that, as in the case of BiCMOS, voltage levels are selected according to the design requirements of the designer. The voltages mentioned hereinbelow are exemplary only, and not to be taken as limiting in any way. These voltage levels happened to be the ones selected for the particular process parameters and design requirements to which the cell was applied. In the embodiment of FIG. 5, normal operation of VFUSE was 1.8 V, while during fuse blowing it is raised as needed, up to 5 V. The voltage VCC was a 3.3 V +/−10% voltage supply. The voltage VDD was a 1.8 V supply. Ground is shown in the figures as GND. All logic signals SEL1, SEL2, ZAPEN, MARGIN and RESET are 1.8 V CMOS logic signals, as are OUT and $\overline{OUT}$.

Transistors 312 and 314 protect the gates of NAND gate 308 and NOR gate 310, respectively, from over-voltage when VFUSE is raised during the fuse blowing operation. Thus, transistors 312 and 314 and VCC functionally replace protection circuit 119 and resistors 74 and 94 of FIG. 1.

Transistors 316 and 318 pull the inputs of NAND gate 308 and NOR gate 310, respectively, high when the fuses are not evaluated. Thus, these transistor ensure a defined logic state and zero power dissipation in this static CMOS logic.

Transistors 320 and 322 are made large enough to handle the large currents generated during the fuse blowing process. When a fuse is selected for blowing, the gate of transistor 320 or 322 is quickly pulled to the 3.3 V supply by means of inverter 252 or 254, respectively.

The logic block 324 takes advantage of the dual supply voltage that is available in this embodiment, and provides a logic level translation from 1.8 V input to 3.3 V needed by inverters 252 and 254, which are 3.3 V devices in order to be able to drive sufficiently high sufficiently rapidly the gates of devices 320 and 322, respectively. The latch configuration for each fuse select path ensures that the voltage to the inputs of inverters 252 and 254 is driven to the rail, i.e., the full 3.3 V.

The fuse evaluation current is set by resistor 326 and transistor 328, and is mirrored to current mirror 330 and current mirror 332. Note that the current mirroring scheme in this embodiment is similar to that of FIG. 1, and the same provisos apply. Thus, the particular ratios here are understood to be merely exemplary as well. Other ratios may be selected for the reasons set forth hereinabove. Current mirror 330 is made of mirroring transistors 334 and 336, and provides a three times current multiplication for evaluation, similar to current mirror 83 of FIG. 1. It is disabled by MARGIN via transistors 338 and 340 in a manner similar to that used to disable current mirror 83 of FIG. 1. Current mirror 332 is made of mirroring transistors 342 and 344, and provides a one third times current multiplication for evaluation, similar to current mirror 91 of FIG. 1. It is enabled by the signal RESET via transistors 272 and 346 in a manner similar to that used to disable current mirror 91 FIG. 1. The purpose and use of the MARGIN signal is the same as that of FIG. 1. Thus, in non-margin mode (MARGIN inactive), transistors 334 and 342 provide current to fuse 212, while transistors 336 and 344 provide current to fuse 214. In margin mode (MARGIN active), the fuse evaluation current is reduced by turning off current mirror 330, i.e., transistors 334 and 336.

The MARGIN signal also controls whether the output of NAND gate 208 or NOR gate 310 is selected, as in FIG. 1.

Thus, in the preferred embodiments disclosed herein the following advantageous features are observed. The fuses are blown on-chip, i.e., after packaging, which allows more accurate Automatic Test Equipment ("ATE") measurements, and accounts for package-induced stress. The circuit is suitable for low-voltage processes. Protection is provided when the supply voltage is raised to blow the fuses, which are typically fabricated in polysilicon. The circuit has built-in redundancy in two parallel fuses, both of which must be blown to pass evaluation. A margin mode, requiring both fuses to be blown to ten times the required resistance value in normal operation is exercised during acceptance testing. In normal field operation, only one of the two fuses must have a blown resistance value ten times lower than during acceptance testing to continue to provide the correct logic value. The fused logic states are evaluated only for a short period of time, and the logic values are latched. This reduces power in normal operation, and prevents accidental toggling of the logic state due to noise coupling. For example, if the fuse state degrades to the edge of proper operation, the state indicated may fluctuate with noise, voltage variations, and the like. By latching the state after a brief evaluation, unwanted switching of the indicated fuse state is avoided. The latching of the fuse state, and subsequent removal or reduction of current to the fuse also prevents re-growth of a blown fuse, which may occur when a constant DC current is forced through it. The fuse cells may be integrated with a serial port and registers, as disclosed above. For testing purposes, the logic states may be externally overwritten. The latched fuse states may be read back. After all required fuses are blown, if any, and margin tests exercised, a last fuse (a "Part Programmed" fuse) may be blown as well. The blown state of this fuse indicates that the part has gone through the test program, and may be made to disable the ZAPEN and MARGIN signals, thereby making sure that there is no more fuse blowing even accidentally. It also prevents any further accidental overwriting into the trim registers thus providing a fool proof safety feature for the stored trim values.

Although the present invention and its advantages have been described in detail, and more than one embodiment described, it should be understood that various changes, substitutions and alterations can be made herein to either embodiment, and other embodiments can be constructed, without departing from the spirit and scope of the invention as defined by the appended claims.

What is claimed is:

1. An on-chip fuse circuit, comprising:
   a fuse capable of being blown during a programming operation; and
   an evaluation circuit for determining whether said fuse is in a blown state, said evaluation circuit including a first determining circuit coupled to said fuse, determining whether said fuse is in a blown state during normal operation, and a second determining circuit coupled to said fuse, determining whether said fuse is in a blown state during a test mode such that a blown state is determined by said second determining circuit only if the resistance of said fuse is substantially greater than that required for said first determining circuit to determine a blown state.

2. An on-chip fuse circuit, comprising:

a fuse capable of being blown during a programming operation; and an evaluation circuit for determining whether said fuse is in a blown state, said evaluation circuit including a first current source coupled to said fuse, providing a first current so as to activate said evaluation circuit to determine said fuse state during normal operation, and a second current source coupled to said fuse, providing a second current, substantially less than said first current, so as to activate said evaluation circuit to determine said fuse state during a test mode such that a blown state is determined by said evaluation circuit only if the resistance of said fuse is substantially greater than that required for said evaluation circuit to determine a blown state during normal operation.

3. An on-chip fuse circuit, comprising:

a fuse capable of being blown during a programming operation;

output logic for determining whether said fuse is blown;

a protection circuit for protecting said output logic during programming; and an evaluation circuit for evaluating whether said fuse is blown, said evaluation circuit including a first current source coupled to said fuse, providing a first predetermined current so as to activate said output logic to read out the condition of said fuse during normal operation, and a second current source coupled to said fuse, providing a second predetermined current, substantially less than said first predetermined current, so as to activate said output logic to read out the condition of said fuse during an evaluation mode such that a blown condition is indicated by said output logic only if the resistance of said fuse is substantially greater than that required for said output logic to indicate a blown condition during normal operation.

4. An on-chip fuse circuit for an integrated circuit according to claim 3, wherein said protection circuit is activated by a protect signal.

5. An on-chip fuse circuit for an integrated circuit comprising:

a plurality of operational fuse circuits each being individually programmable by the application of a programming voltage, usable in conjunction with other circuitry to set predetermined parameters; and an indication fuse circuit associated with said operational fuse circuits to indicate, when blown, that said operational fuse circuits have been programmed, wherein said operational fuse circuits further comprise:

an evaluation circuit for determining whether said fuse is in a blown state, said evaluation circuit including a first determining circuit coupled to said fuse, whether said fuse is in a blown state during normal operation, and a second determining circuit coupled to said fuse, determining whether said fuse is in a blown state during a test mode such that a blown state is determined by said second determining circuit only if the resistance of said fuse is substantially greater than that required for said first determining circuit to determine a blown state.

6. An on-chip fuse circuit for an integrated circuit according to claim 5, comprising:

a disable circuit coupled to said indication fuse circuit that prevents activation of said second determining circuit in said operational fuse circuits when said indication fuse circuit is blown.

7. An on-chip fuse circuit for an integrated circuits, comprising:

a plurality of operational fuse circuits each being individually programmable by the application of a programming voltage, usable in conjunction with other circuitry to set predetermined parameters;

an indication fuse circuit associated with said operational fuse circuits to indicate, when blown, that said operational fuse circuits have been programmed;

a state indication circuit associated with said operational fuse circuits that operates in a start mode of said integrated circuit to apply power to said fuse circuits to sense the state of said fuse circuits and store the sensed states in a storage unit for use during normal operation of said integrated circuit; and overwrite protection circuitry responsive to said indication fuse circuit that, when said indication fuse circuit indicates that said operational fuse circuits have been programmed, prevents overwriting of a stored state in said storage unit after said sensed states have been stored in said storage unit.

8. An on-chip fuse circuit for an integrated circuit, comprising:

a plurality of fuse circuits each being individually programmable to a blown state, usable in conjunction with other circuitry to set predetermined parameters; and a state indication circuit associated with said fuse circuits that operates in a start mode of said integrated circuit to apply power to said fuse circuits to sense the state of said fuse circuits and store the sensed states in a storage unit for use during normal operation of said integrated circuit, such that said applied power may be reduced subsequent to the storage of said sensed state of said fuse circuits.

9. An on-chip fuse circuit for an integrated circuit according to claim 8, further comprising:

first write circuitry that, when activated, causes writing a state to said storage unit to a location for storing a state of one of said fuse circuits, regardless of the state of said fuse circuit.

10. An on-chip fuse circuit for an integrated circuit, comprising:

a plurality of operational fuse circuits each being individually programmable by the application of a programming voltage; and a storage unit coupled to said operational fuse circuits for receiving from said operational fuse circuits indications of their programmed state and storing said indications for use in operation of said integrated circuit.

11. An on-chip fuse circuit as in claim 10, wherein said operational fuse circuits may have their power reduced subsequent to storage of said indications in said storage unit.

12. An on-chip fuse circuit as in claim 10, wherein said storage unit is readable, such that indications of said programmed state of said operational fuse circuits storage unit may be read therefrom after being stored therein.

13. An on-chip fuse circuit for an integrated circuit, comprising:

a plurality of operational fuse circuits each being individually programmable by the application of a programming voltage;

a storage unit coupled to said operational fuse circuits for receiving from said operational fuse circuits indications of their programmed state and storing said indications for use in operation of said integrated circuit; and an input/output ("I/O") port coupled to said storage unit, such that data may be transmitted through said I/O port and stored in said storage unit at locations designated for storage of said indications.

14. An on-chip fuse circuit as in claim 13, further comprising an indication fuse circuit associated with said operational fuse circuits to indicate, when blown, that said operational fuse circuits have been programmed.

15. An on-chip fuse circuit as in claim 14, further comprising:

a disable circuit coupled to said indication fuse circuit that prevents storage of data from said I/O port in said storage unit when said indication fuse circuit is blown.

* * * * *